United States Patent
Fang et al.

(10) Patent No.: US 12,317,622 B2
(45) Date of Patent: May 27, 2025

(54) PIXEL ARRAY PROVIDING FLICKER REDUCTION AND DYNAMIC RANGE

(71) Applicant: Taiwan Semiconductor Manufacturing Company, Ltd, Hsinchu (TW)

(72) Inventors: Chun-Lin Fang, Tainan (TW); Ping-Hao Lin, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 110 days.

(21) Appl. No.: 16/949,928

(22) Filed: Nov. 20, 2020

(65) Prior Publication Data

US 2022/0165771 A1 May 26, 2022

(51) Int. Cl.
*H10F 39/00* (2025.01)
(52) U.S. Cl.
CPC ....... *H10F 39/8057* (2025.01); *H10F 39/024* (2025.01); *H10F 39/807* (2025.01)
(58) Field of Classification Search
CPC ......... H01L 27/14623; H01L 27/14685; H01L 27/14643; H01L 27/14625; H01L 27/14632; H01L 27/1463; H01L 24/14643; H10F 39/199; H10F 39/8053; H10F 39/8057; H10F 39/807
See application file for complete search history.

(56) References Cited

U.S. PATENT DOCUMENTS

| | | | |
|---|---|---|---|
| 9,590,005 B1 | 3/2017 | Qian et al. | |
| 10,553,733 B2 | 2/2020 | Huang et al. | |
| 2012/0147208 A1* | 6/2012 | Otsuka | H01L 27/14629 257/E31.127 |
| 2014/0253767 A1* | 9/2014 | Kato | H04N 25/134 257/432 |
| 2019/0148450 A1* | 5/2019 | Wei | H01L 27/1463 257/184 |
| 2019/0386049 A1 | 12/2019 | Jung | |
| 2020/0099846 A1 | 3/2020 | Cheng et al. | |
| 2020/0260026 A1* | 8/2020 | Ono | H01L 27/14645 |
| 2021/0151482 A1* | 5/2021 | Phan | H01L 27/14621 |

FOREIGN PATENT DOCUMENTS

TW I653754 B 3/2019

* cited by examiner

*Primary Examiner* — Nelson Garces
(74) *Attorney, Agent, or Firm* — Harrity & Harrity, LLP

(57) ABSTRACT

A pixel array may include a plurality of pixel regions including a first pixel region and a second pixel region. The pixel array may include a metal grid structure over the plurality of pixel regions. The pixel array may include a light blocking layer. A first portion of the light blocking layer may be over the first pixel region and under the metal grid structure. The first portion may have a first thickness. A second portion of the light blocking layer may be over the second pixel region and under the metal grid structure. The second portion may have a second thickness that is different from the first thickness.

20 Claims, 18 Drawing Sheets

PIXEL ARRAY PROVIDING FLICKER REDUCTION AND DYNAMIC RANGE

BACKGROUND

An image sensor, such as a complementary metal oxide semiconductor (CMOS) image sensor, includes an array of pixel regions and supporting logic. The pixel regions of the array are semiconductor devices for measurements of incident light (i.e., light that is directed toward the pixel regions), and the supporting logic facilitates readout of the measurements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
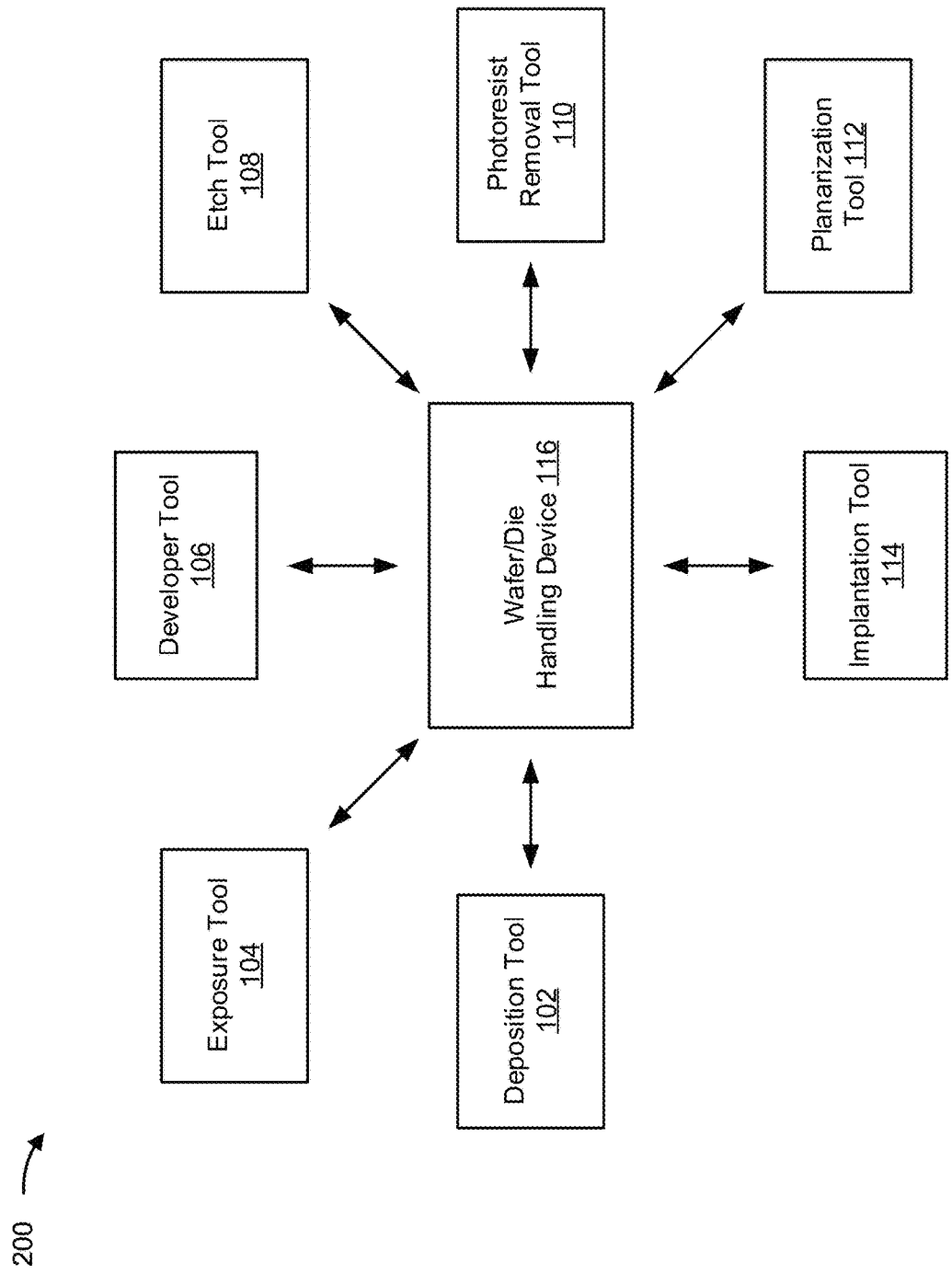
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "front," "back," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, image sensors, such as charge coupled device (CCD) and CMOS image sensors, have a dynamic range of approximately 70 decibels (dB). An image sensor with a high dynamic range (e.g., 100 dB or more) may be needed in some applications. For example, an image sensor with a dynamic range of 100 dB or more may be needed in an automotive application to be able to handle different extreme lighting conditions, such as driving from a dark tunnel into bright sunlight. Another example of an extreme lighting condition in the automotive context occurs when the image sensor needs to image light emitting diode (LED) illuminated light sources (e.g., vehicle lights, traffic lights, signs, and/or the like) that are pulsed at for example 90-300 Hertz (Hz) with a high peak light intensity. In such an LED lighting situation, there is often flickering present in output images caused by the LED light sources, which can result in unreliable or inaccurate image sensing. Thus, in addition to requiring a high dynamic range, the image sensor may need to employ an LED flicker reduction (LFR) technique.

One technique for providing LED flicker reduction is to include pixel regions in the array that have a low quantum efficiency (QE) (e.g., as compared to a QE of "standard" pixel regions of the array). The low QE pixel regions have a longer integration time without being overexposed, which facilitates capture of LED light and, therefore, can be utilized to reduce LED flicker. In some cases, low QE is achieved in a pixel region by partially blocking light received by the pixel region. The partial light blocking can be achieved by forming a light blocking layer above the pixel region. The light blocking layer can be, for example, a metal layer, such as a titanium (Ti) layer or a titanium nitride (TiN) layer. The light blocking layer is formed over a metal grid structure of the pixel array, where the metal grid structure is a structure designed to provide isolation of pixel regions in the array and to direct incoming light (e.g., toward a pixel region).

In practice, tight control of both thickness and uniformity of the light blocking layer are critical for providing a low QE pixel region. However, the thickness and the uniformity of the light blocking layer are impacted by a design of the metal grid structure. Therefore, as dimensions of the metal grid structure become smaller and smaller, the light blocking layer is impacted. For example, with miniaturization of pixel arrays, widths of pillars of the metal grid structure become smaller, meaning that formation of the light blocking layer such that the light blocking layer lies on the pillars becomes challenging or even impossible. As another example, distances between the pillars of the metal grid structure decrease with miniaturization of pixel arrays, meaning that controlling thickness and uniformity of the light blocking layer between the pillars becomes challenging or even impossible.

Some implementations described herein provide techniques and apparatuses for a pixel array that provides LFR and improves dynamic range. In some implementations, the pixel array includes a plurality of pixel regions and a metal grid structure over the plurality of pixel regions. In some implementations, the pixel array includes a light blocking layer, a first portion of which is over a first pixel region and under the metal grid structure and a second portion of which is over the second pixel region and under the metal grid structure. Here, the first portion of the light blocking layer has a first thickness and the second portion of the light blocking layer has a second thickness that is different from (e.g., greater than or less than) the first thickness. In some implementations, the pixel array includes a third pixel region, and the light blocking layer is not present substantially over the third pixel region.

Notably, the light blocking layer is formed before the metal grid structure, meaning that the light blocking layer is beneath the metal grid structure (e.g., rather than being formed on or over the metal grid structure). By forming the light blocking layer such that the light blocking layer is beneath the metal grid structure, dimensions of the metal grid structure do not impact uniformity and thickness of the light blocking layer. As a result, the uniformity and thickness of the light blocking layer can be tightly controlled even with miniaturization of the metal grid structure, without impacting performance of the pixel array.

Furthermore, a thickness of the light blocking layer can differ over different pixel regions of the pixel array. For example, as noted above, the light blocking layer can have a first thickness over the first pixel region, can have a second (different) thickness over the second pixel region, and may not be present over the third pixel region. As a result, QEs vary among the pixel regions of the pixel array. For example, the first pixel region may be a low QE region (e.g., when the first thickness is greater than the second thickness), the second pixel region may be a middle QE region, and the third pixel region may be a normal QE region (e.g., since no light blocking layer is formed over the third pixel region). Such a multi-QE pixel array improves dynamic range of the pixel array. Further, in some implementations, the light blocking layer may serve to reduce crosstalk between pixel regions of the pixel array. Additional details are provided below.

FIG. 1 is a diagram of an example environment 100 in which systems and/or methods described herein may be implemented. As shown in FIG. 1, environment 100 may include a plurality of semiconductor processing tools 102-114 and a wafer/die handling device 116. The plurality of semiconductor processing tools 102-114 may include a deposition tool 102, an exposure tool 104, a developer tool 106, an etch tool 108, a photoresist removal tool 110, a planarization tool 112, an implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 may deposit a metal material to form one or more conductors or conductive layers, may deposit an insulating material to form a dielectric or insulating layer, and/or the like as described herein. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The photoresist removal tool 110 is a semiconductor processing tool that is capable of removing a portion of a photoresist layer deposited a substrate. For example, the photoresist removal tool 110 may remove remaining portions of the photoresist layer (e.g., using a chemical stripper and/or another technique) after the etch tool 108 etches the substrate 202.

The planarization tool 112 is a semiconductor processing tool that is capable of polishing or planarizing various layers of a wafer or semiconductor device. For example, a polishing device may include a chemical mechanical polishing (CMP) device and/or another type of polishing device. In some implementations, the polishing device may polish or planarize a layer of deposited or plated material. A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the wafer is rotated. The polishing pad may also be rotated to ensure a continuous supply of slurry is applied to the polishing pad.

The implantation tool 114 is a semiconductor processing tool that is used to implant ions into a substrate of a semiconductor wafer. In some implementations, the implantation tool 114 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. In some implementations, the implantation tool 114 can be used to form a SPAD in a substrate, as described herein.

Wafer/die handling device 116 includes a mobile robot, a robot arm, a tram or rail car, and/or another type of device that are used to handle wafers and/or dies and/or transport wafers and/or dies between semiconductor processing tools 102-114 and/or to and from other locations such as a wafer rack, a storage room, and/or the like. In some implementations, wafer/die handling device 116 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
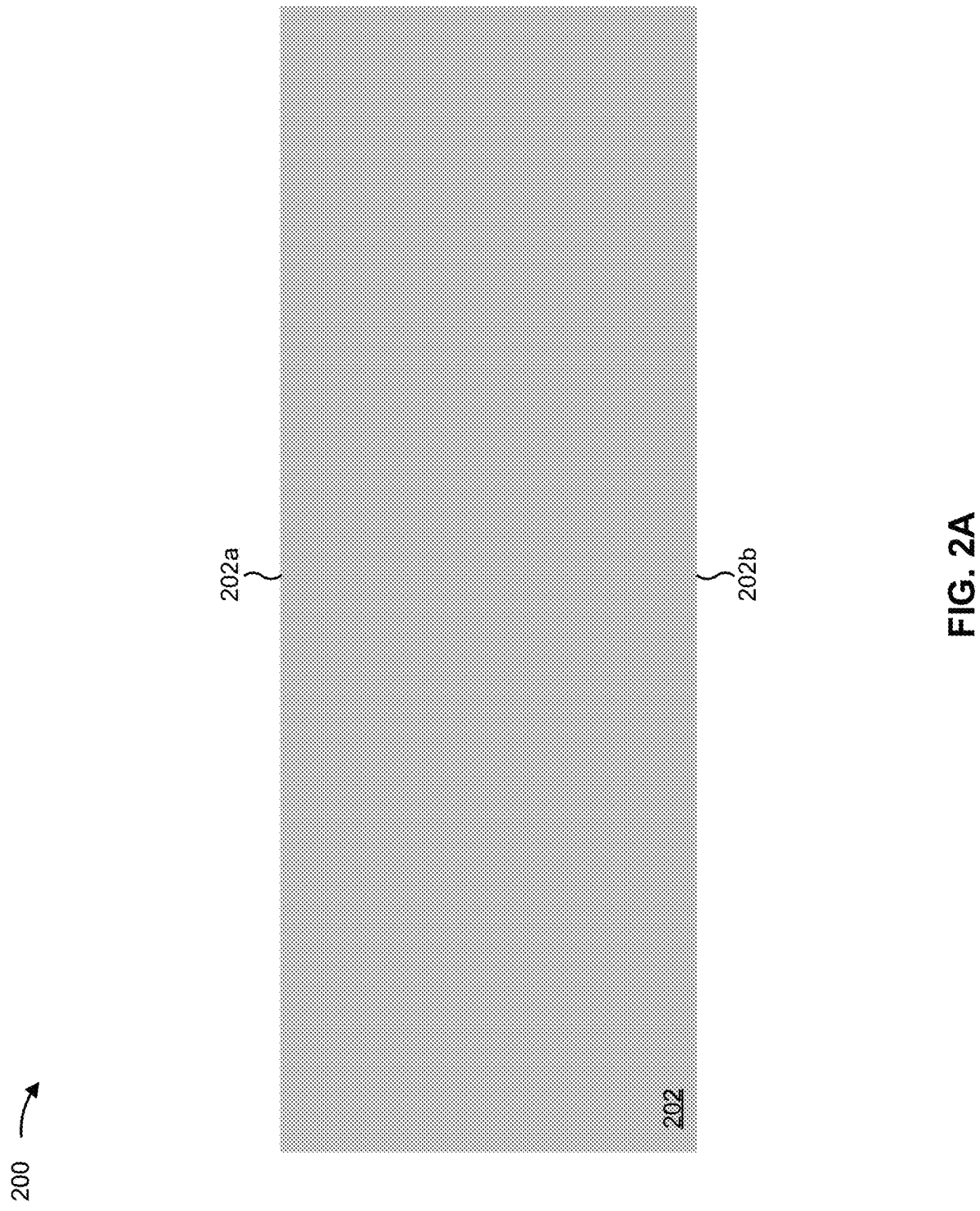
FIGS. 2A-2N are diagrams of an example of forming a pixel array that enables light emitting diode (LED) flicker reduction and improved dynamic range, as described herein.
Figure 2B:
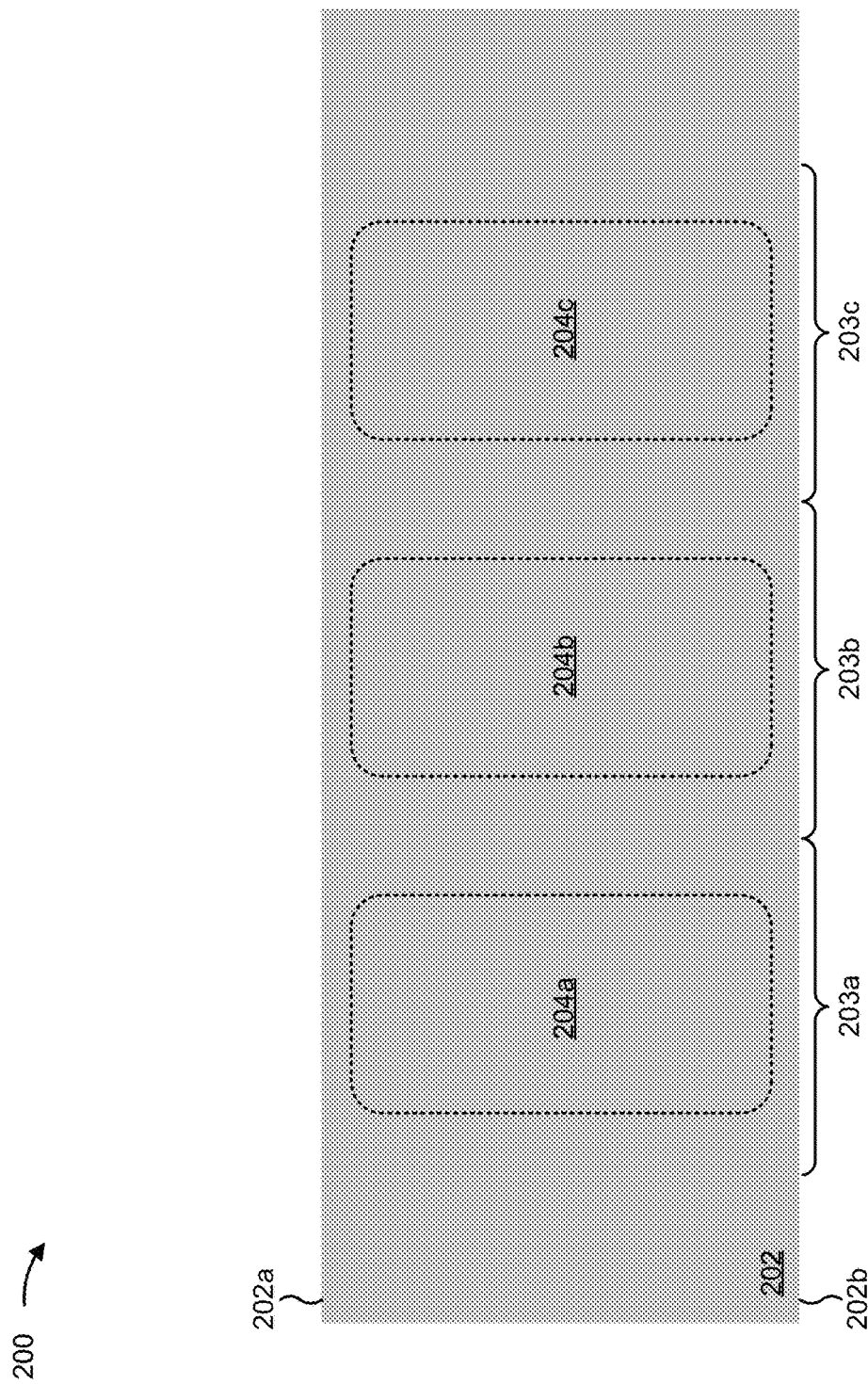
Figure 2C:
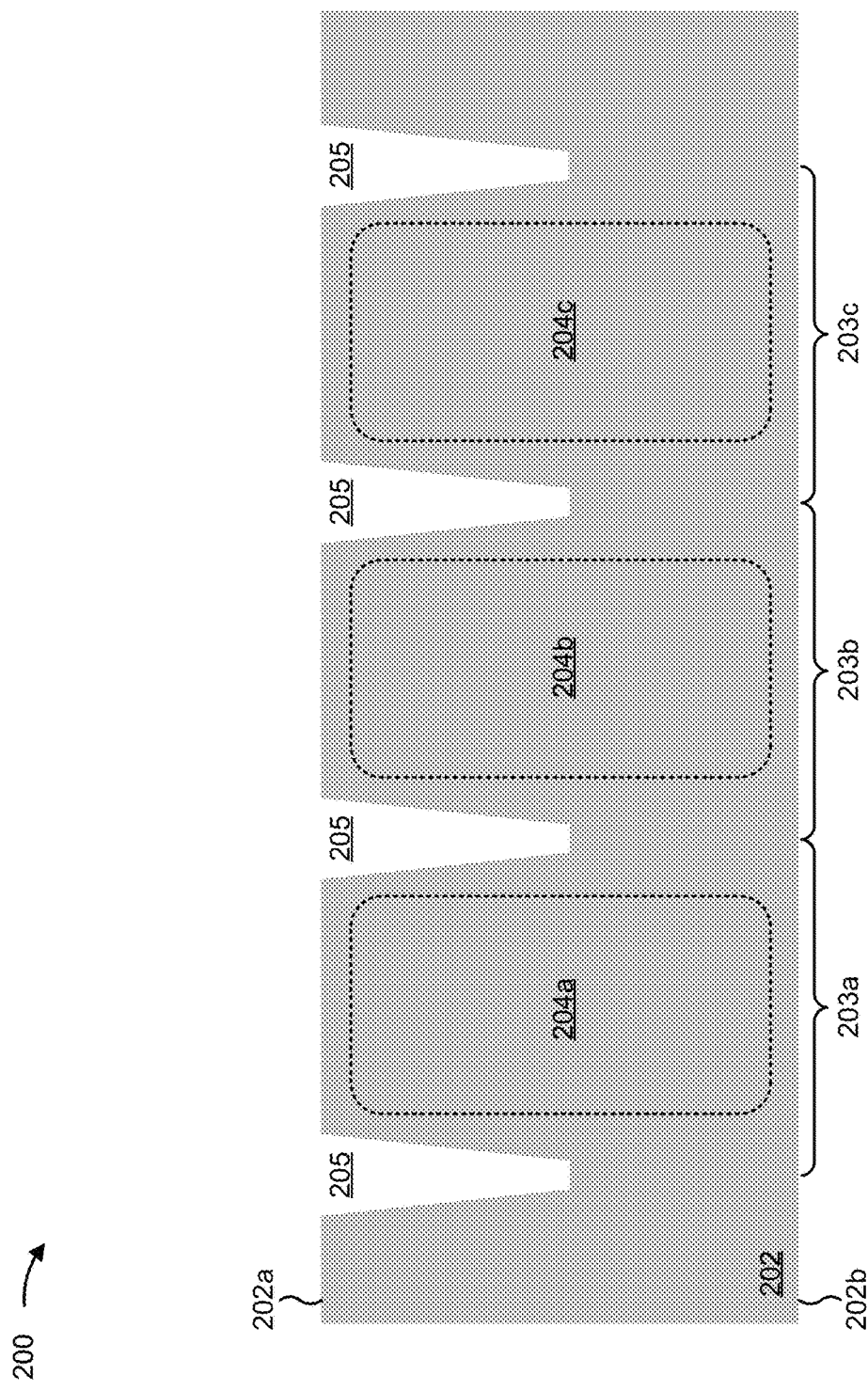
Figure 2D:
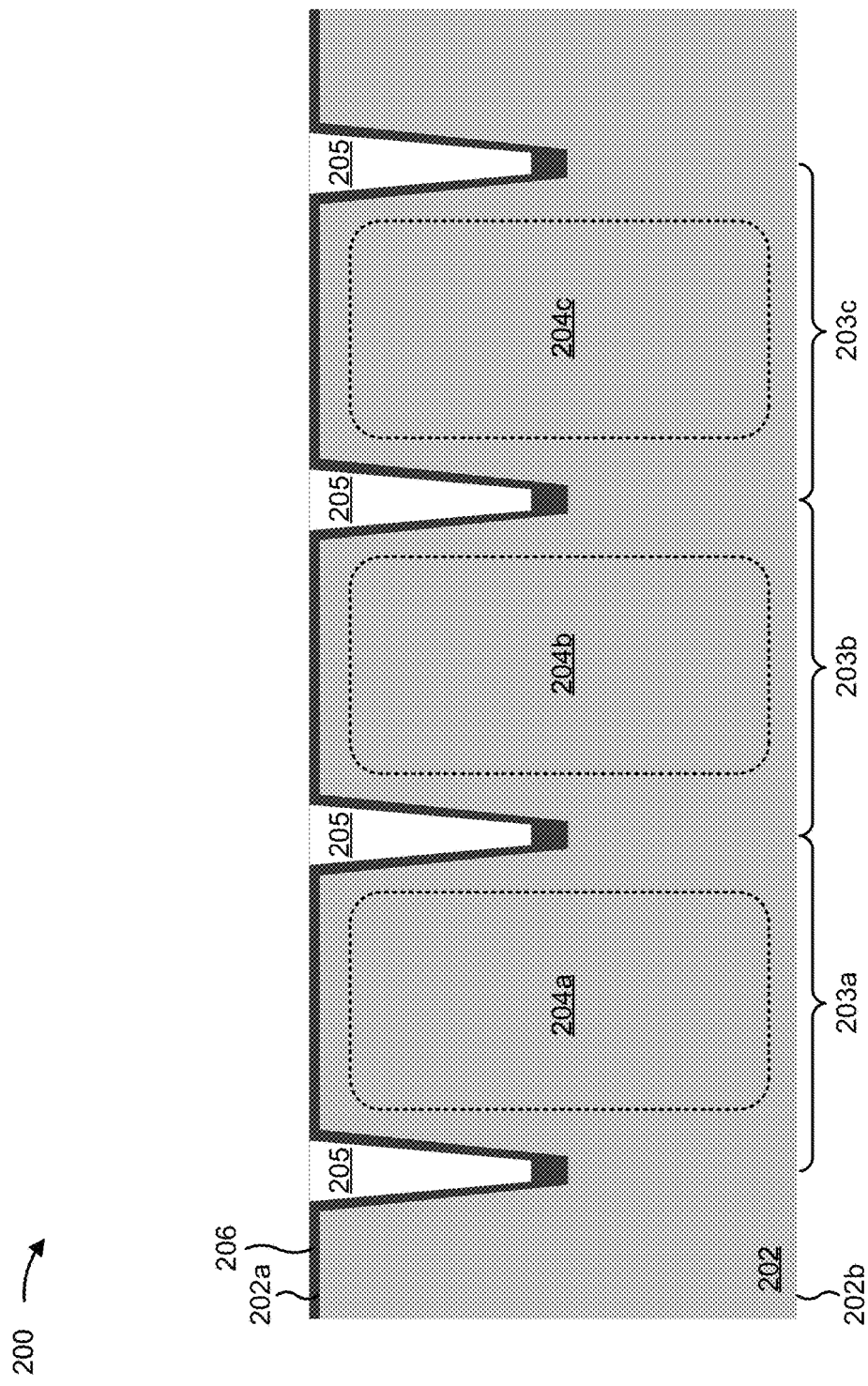
Figure 2E:
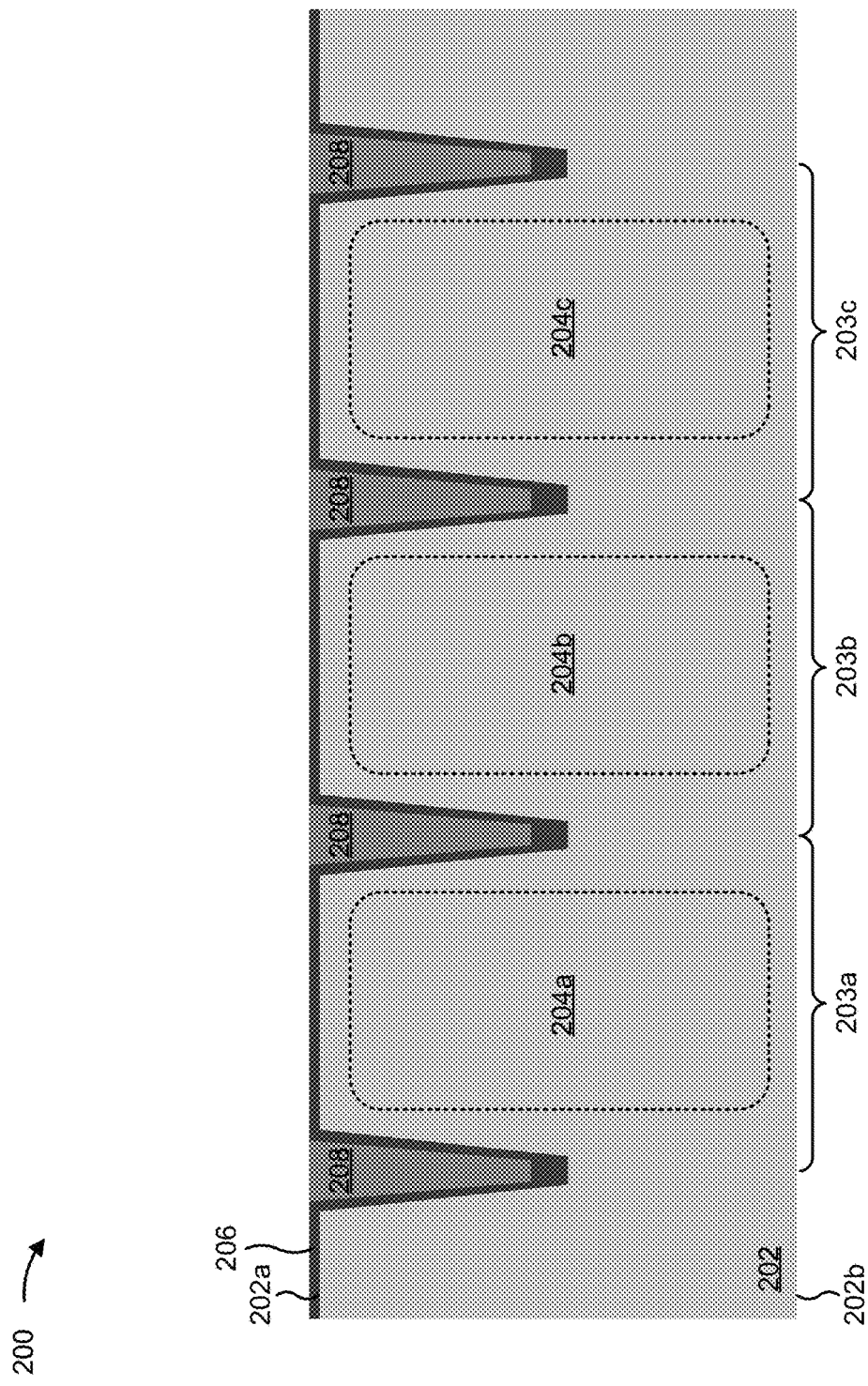
Figure 2F:
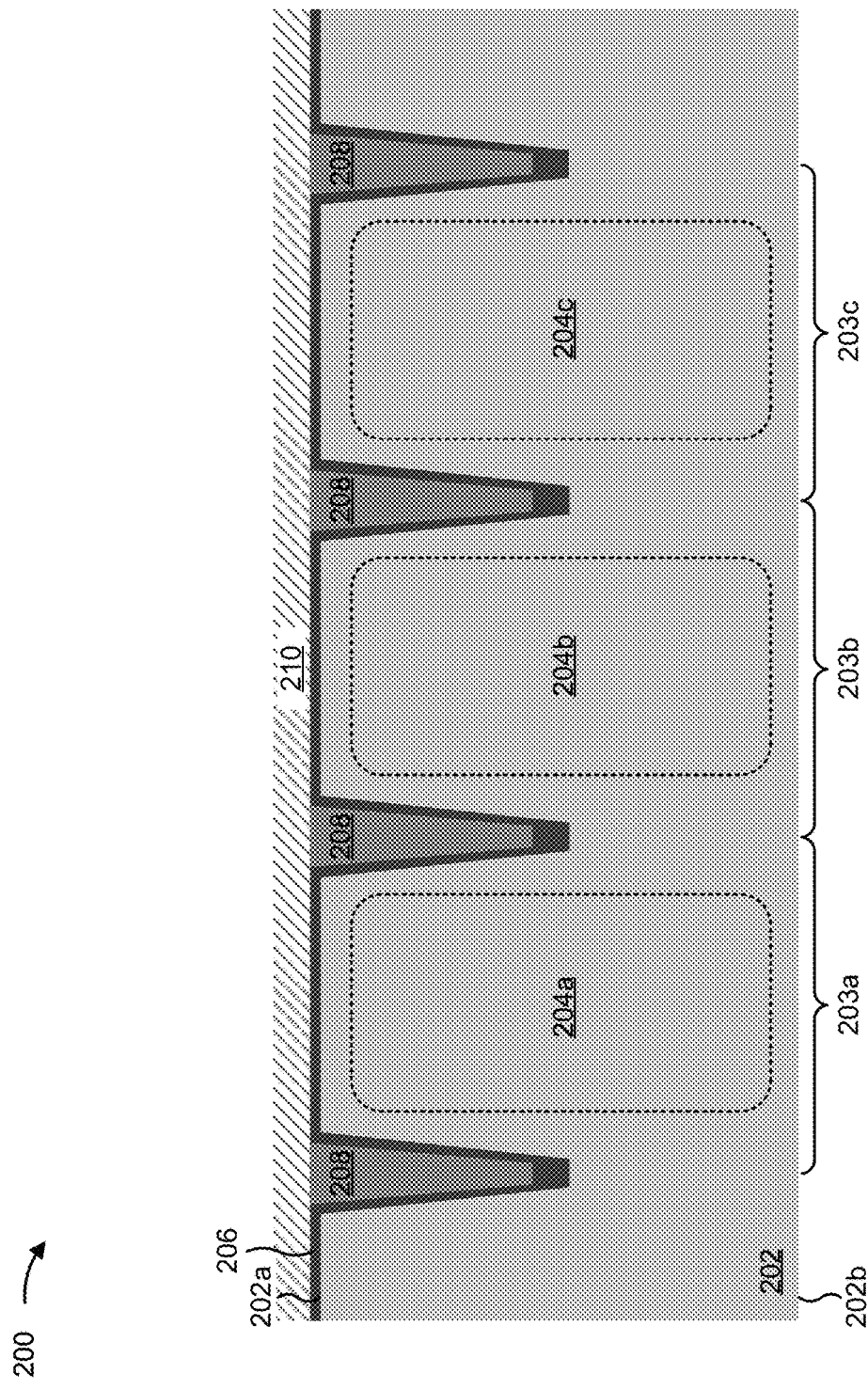
Figure 2G:
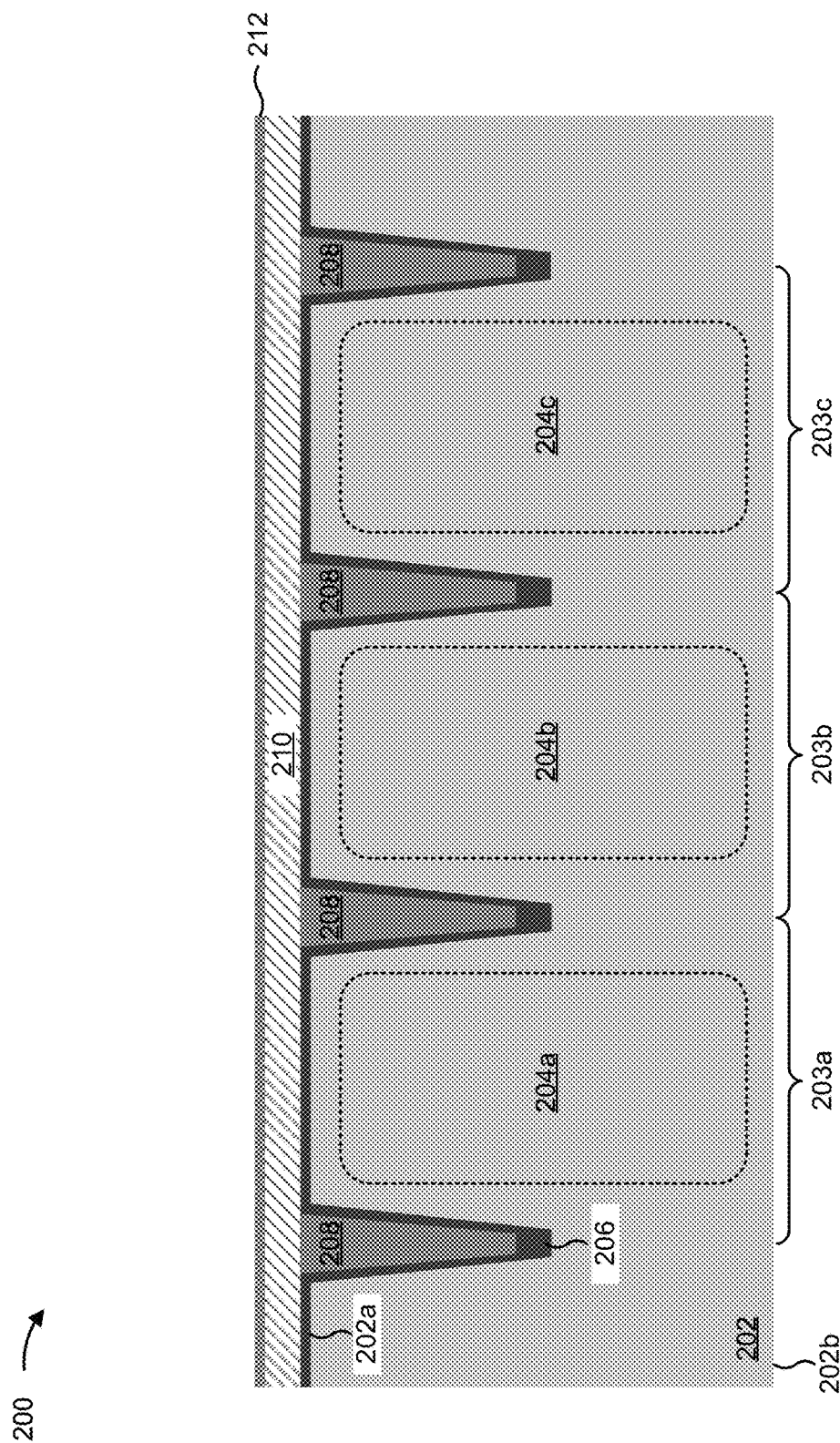
Figure 2H:
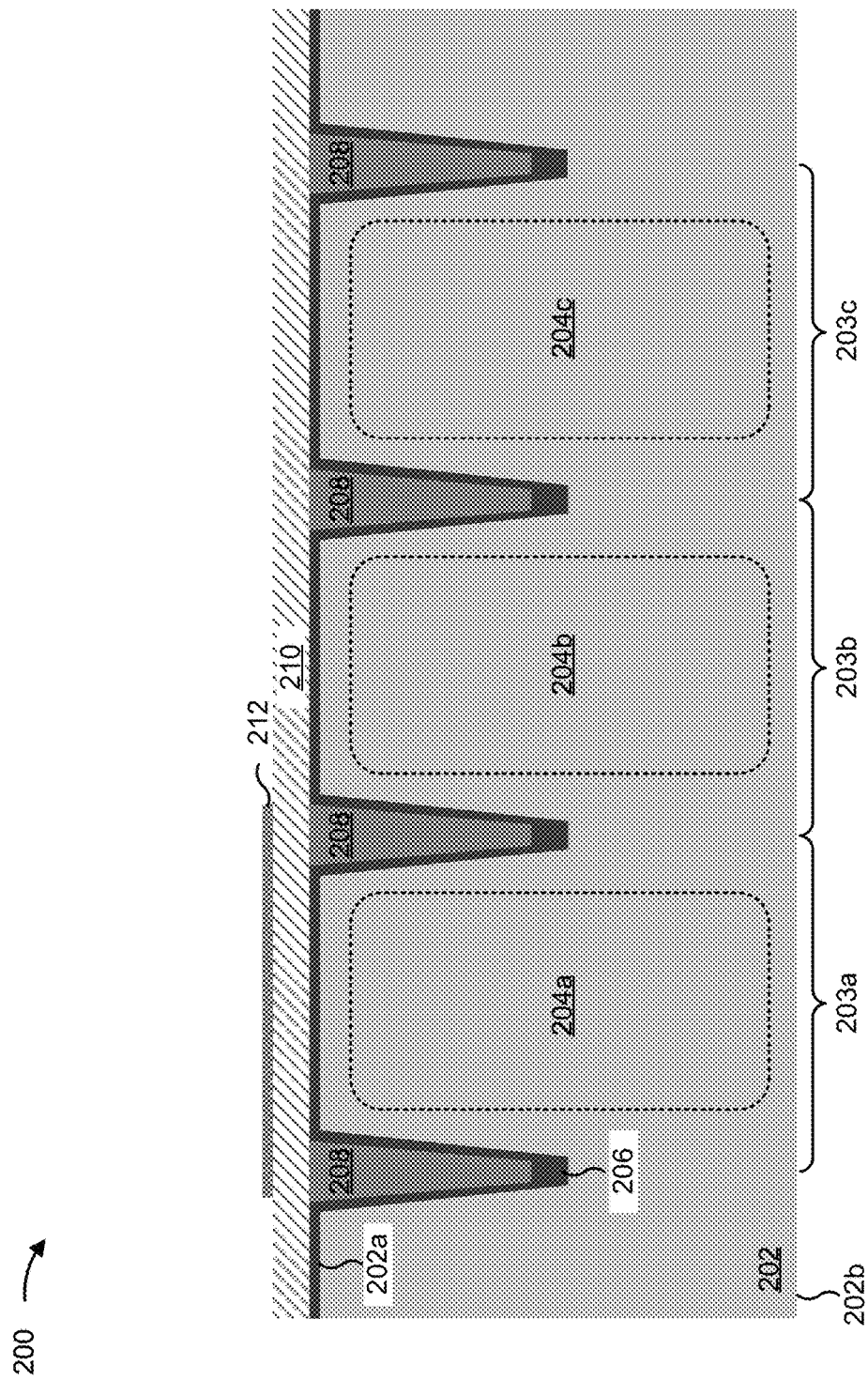
Figure 2I:
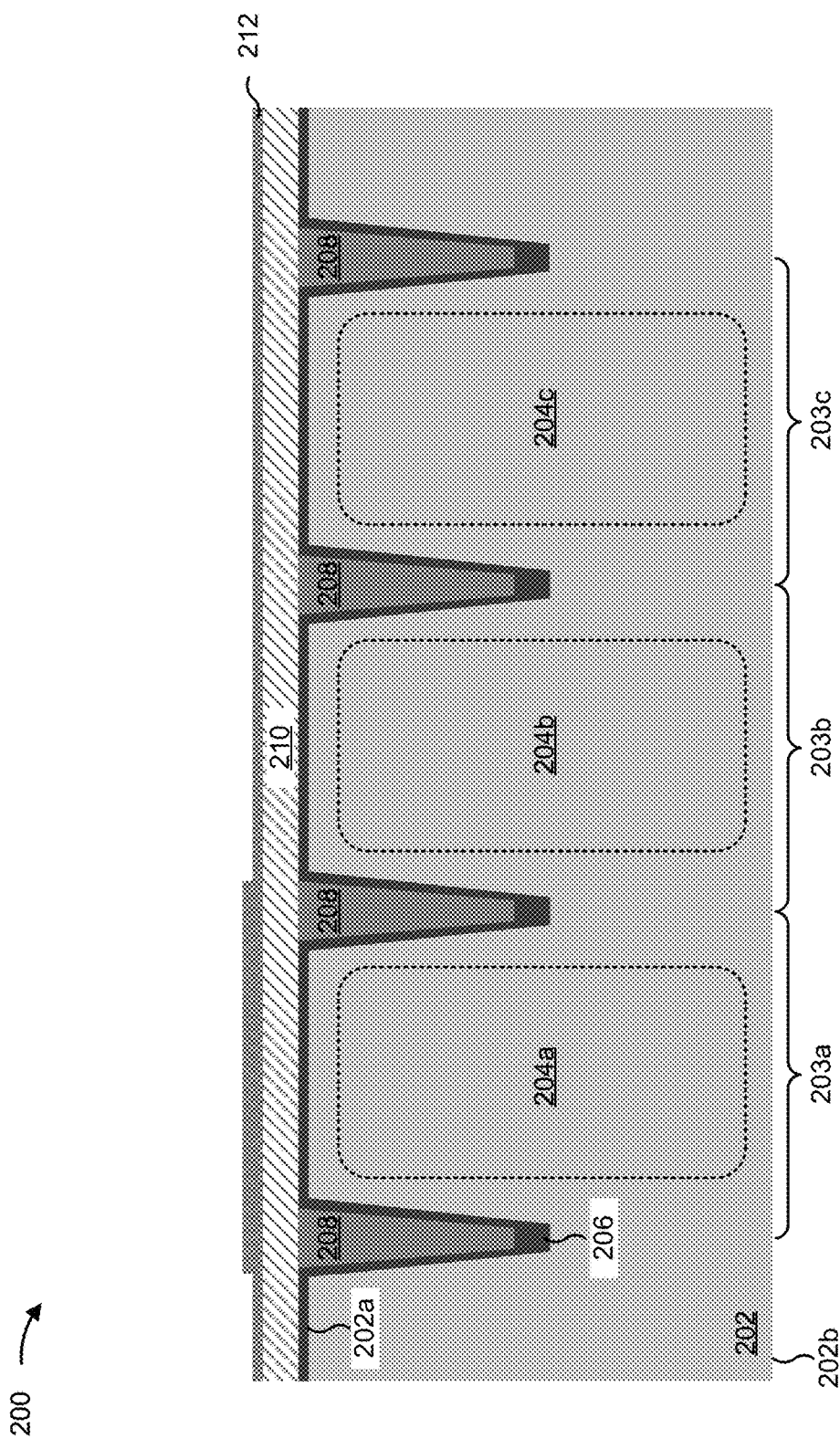
Figure 2J:
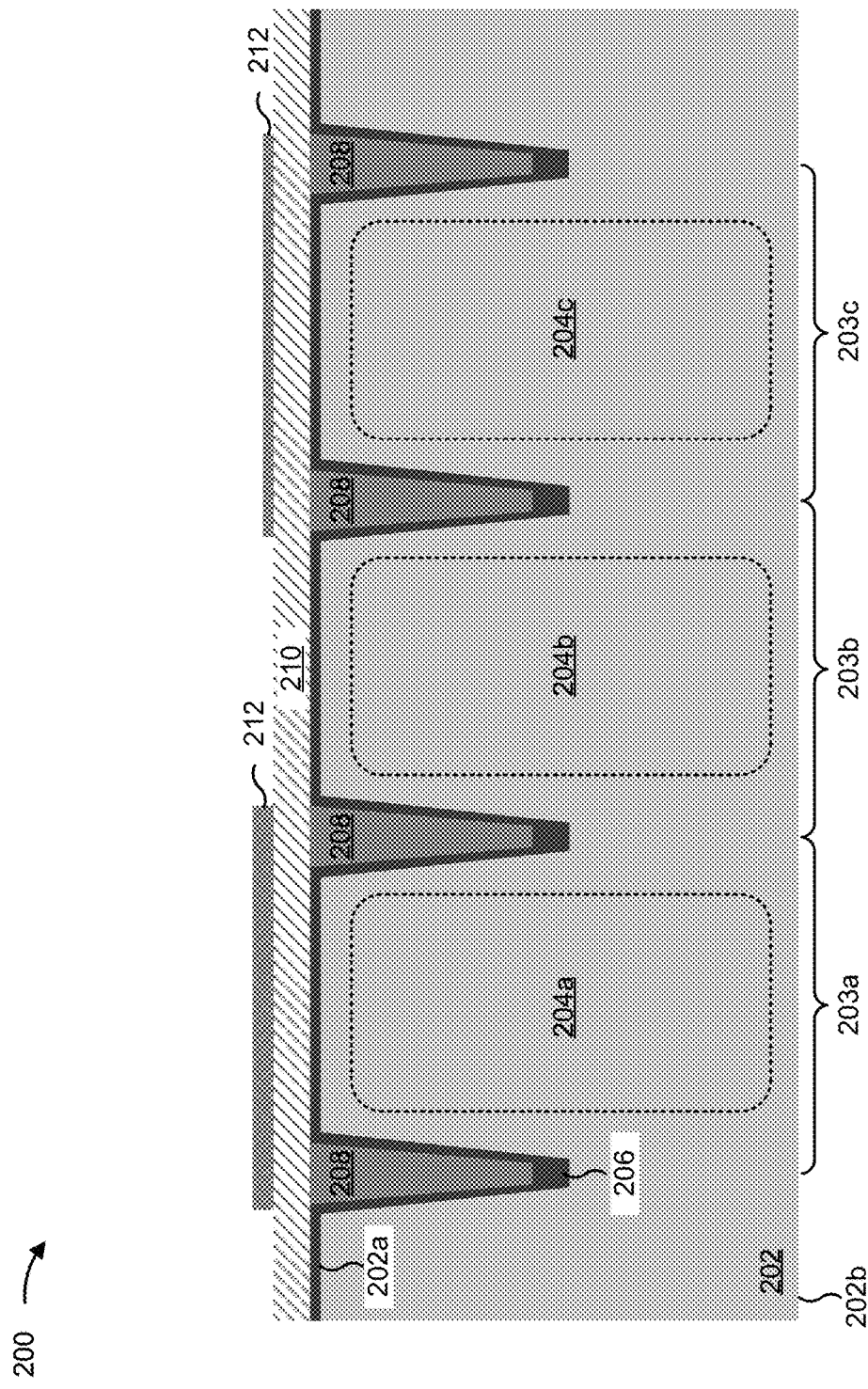
Figure 2K:
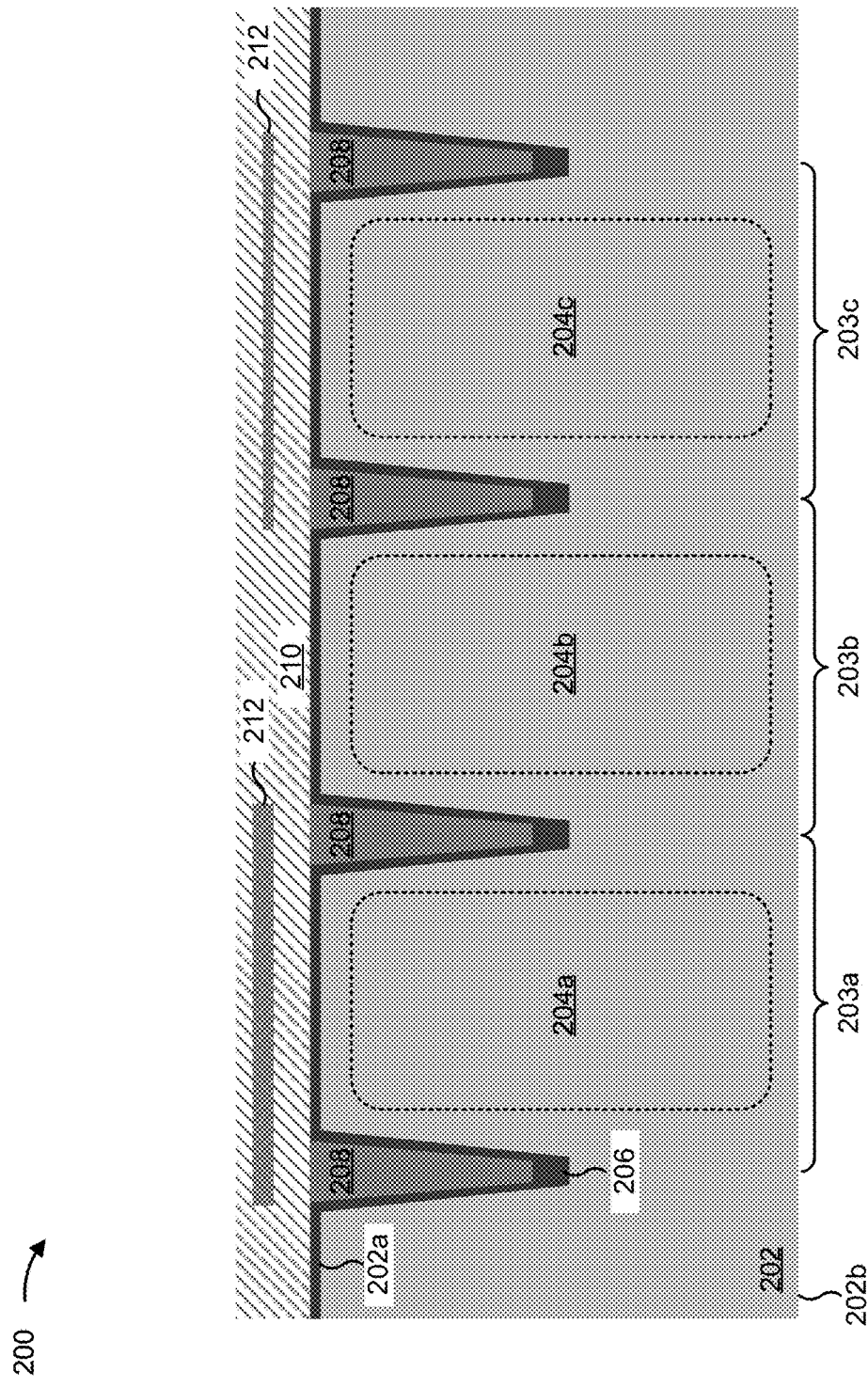
Figure 2L:
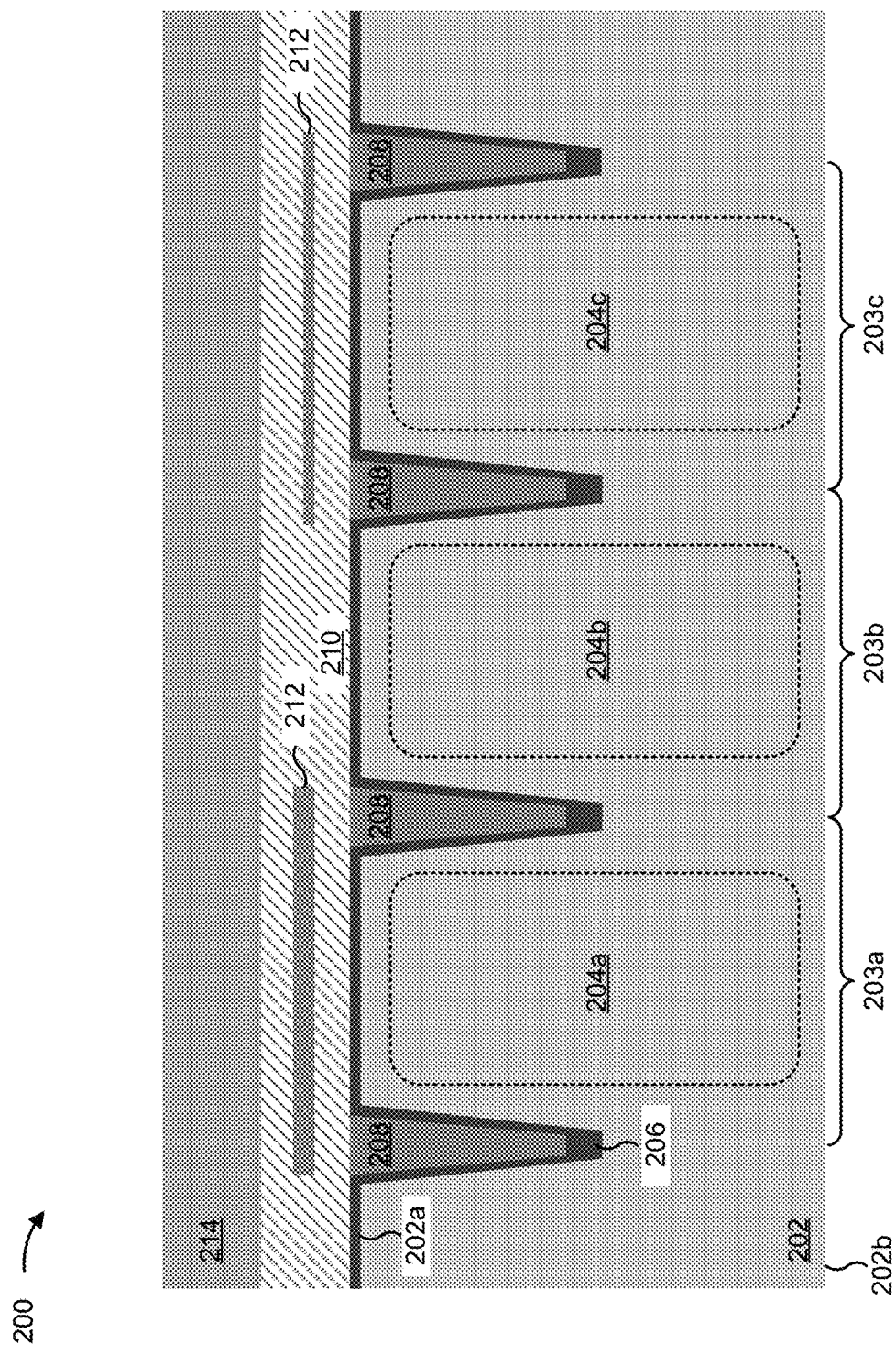
Figure 2M:
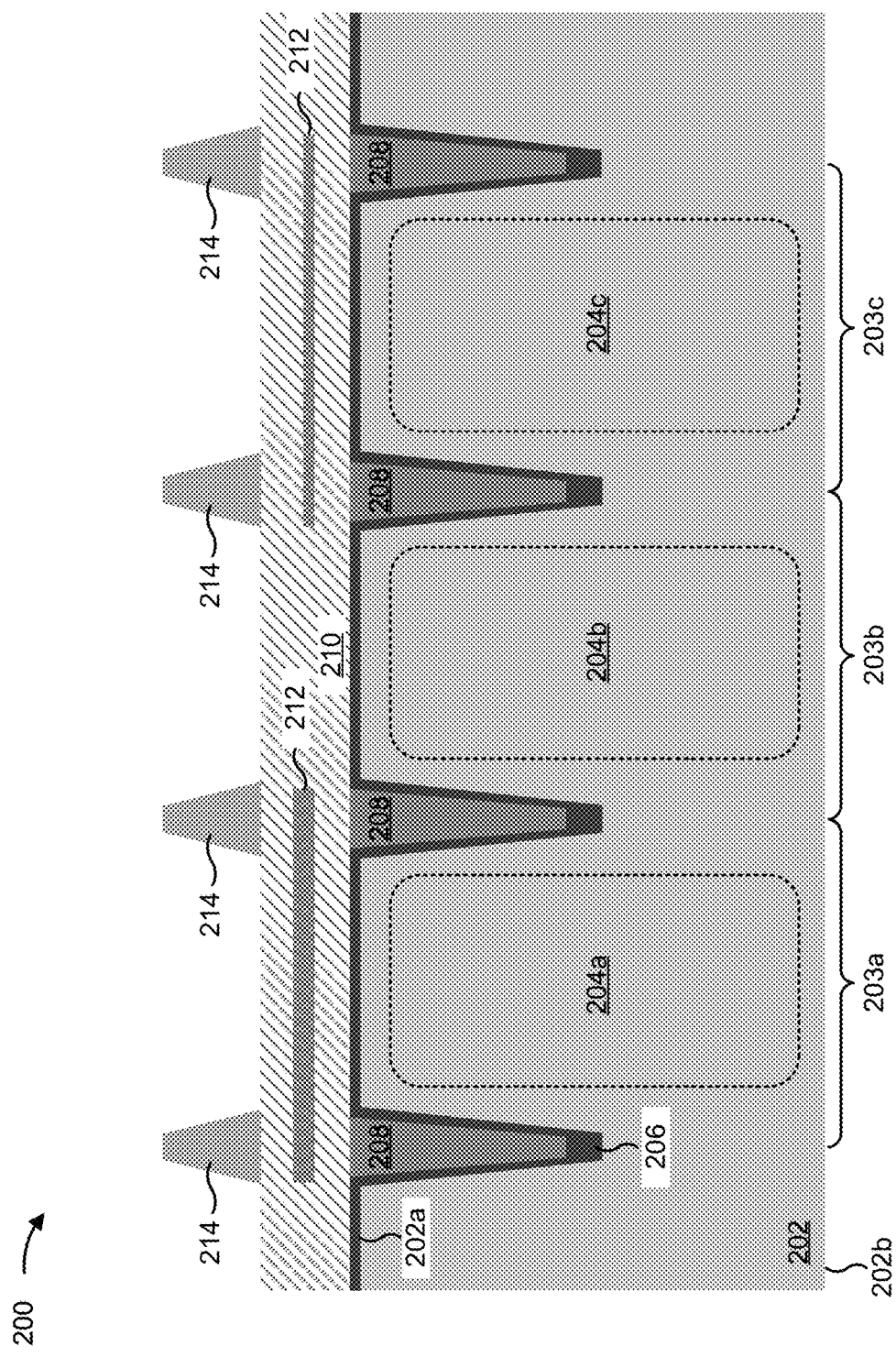
Figure 2N:
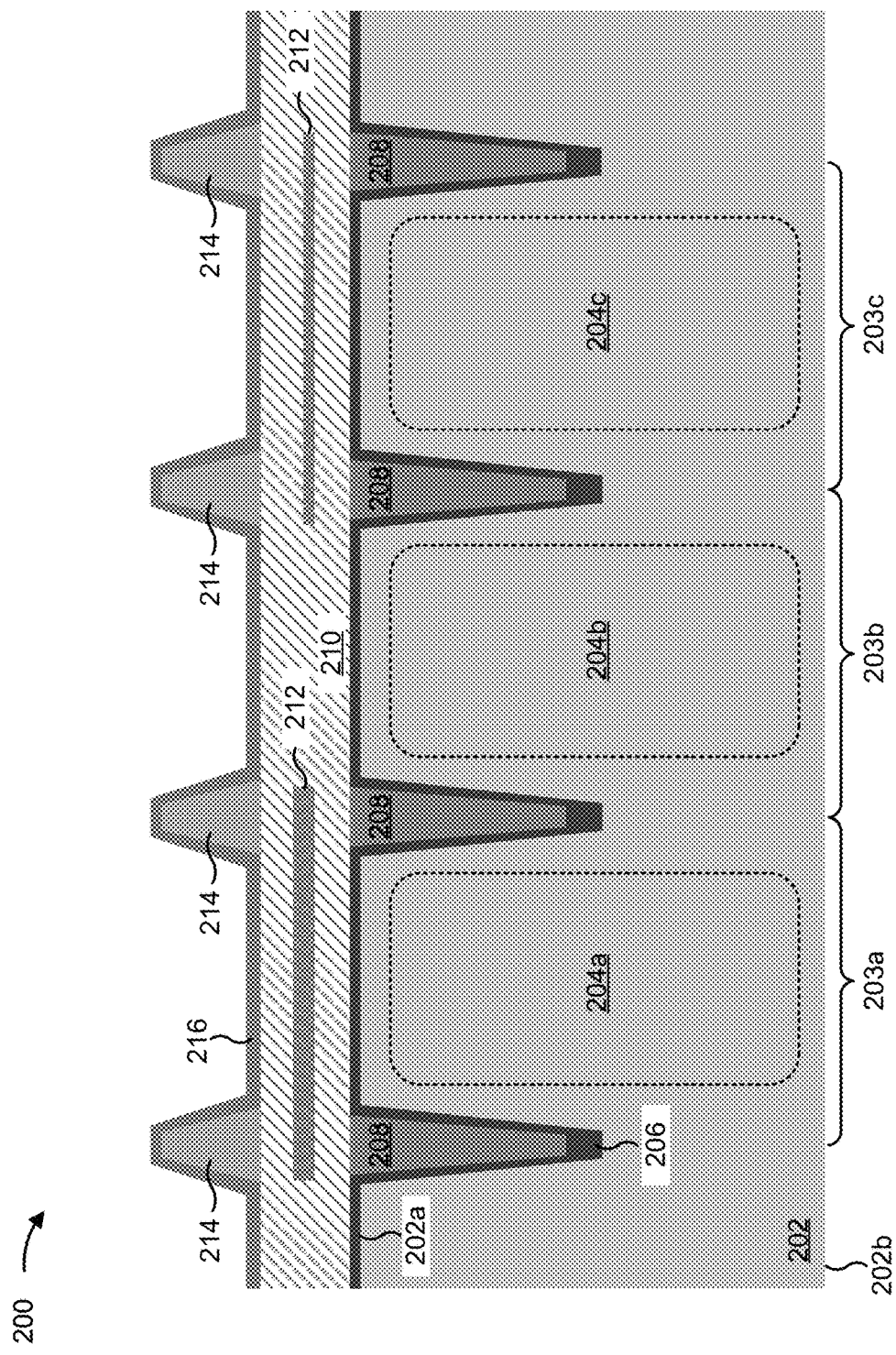

FIGS. 2A-2N are diagrams of an example of forming a pixel array 200 (or a portion thereof) that enables LFR and improved dynamic range. The pixel array 200 may be included in an image sensor, such as a CMOS image sensor or another type of image sensor.

As shown in FIG. 2A, as part of a process associated with forming pixel array 200, a substrate 202 is provided. The substrate 202 may include a semiconductor die substrate, a semiconductor wafer, or another type of substrate in which semiconductor pixels may be formed. In some implementations, the substrate 202 is formed of silicon, a material including silicon, a III-V compound semiconductor material such as gallium arsenide (GaAs), a silicon on insulator (SOI), or another type of semiconductor material that is capable of generating a charge from photons of incident light. As shown in FIG. 2A, the substrate 202 includes a first surface 202a and a second surface 202b.

As shown in FIG. 2B, a plurality of pixel regions 203 of the pixel array 200 may be formed in the substrate 202. For example, a pixel region 203a may be formed by doping a portion of the substrate 202, a pixel region 203b may be formed by doping another portion of the substrate 202, a pixel region 203c may be formed by doping another portion of the substrate 202, and so on. Some of the pixel regions 203 may be adjacent pixel regions (e.g., pixel regions that are next to and/or share a side with each other) and some of the pixel regions 203 may be non-adjacent pixel regions.

In some implementations, a semiconductor processing tool (e.g., the implantation tool 114) dopes the portions of the substrate 202 using an ion implantation technique to form a photodiode 204 in each of the pixel regions 203 (e.g., a photodiode 204a in pixel region 203a, a photodiode 204b in pixel region 203b, a photodiode 204c in pixel region 203c, and so on). In these examples, the semiconductor processing tool may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. In some implementations, other techniques and/or types of ion implantation tools are used to form the ion beam. The ion beam may be directed at the pixel regions 203 to implant ions in the substrate 202, thereby doping the substrate 202 to form the photodiodes 204 in each of the pixel regions 203. In some implementations, the substrate 202 may be doped with a plurality of types of ions to form a p-n junction for each photodiode 204. For example, the substrate 202 may be doped with an n-type dopant to form a first portion (e.g., an n-type portion) of a photodiode 204 and a p-type dopant to form a second portion (e.g., a p-type portion) of the photodiode 204.

As shown in FIGS. 2C-2E, one or more deep trench isolation (DTI) elements 208 are formed at sides of (e.g., at boundaries of) pixel regions 203 of the substrate 202, where the one or more DTI elements 208 are formed in one or more openings 205 on the first surface 202a of the substrate 202. In some implementations, a boundary of a pixel region 203 is defined by a near edge of a DTI element 208 at a side of the pixel region 203, by a far edge of the DTI element 208 at the side of the pixel region 203, by a substantial middle of the DTI element near to the pixel region 203, or at another point relative to the DTI element 208 at the side of the pixel region 203. In some implementations, a boundary of a given pixel region 203 may partially overlap a boundary of an adjacent pixel region 203. For example, if a boundary of the pixel region 203a is defined by the far edge of the DTI element 208 between the pixel region 203a and the pixel region 203b and a boundary of the pixel region 203b is defined by the far edge of the DTI element 208 between the pixel region 203a and the pixel region 203b, then the boundary of the pixel region 203a partially overlaps the boundary of the pixel region 203b.

The DTI element 208 is an element to provide isolation for photodiodes 204 of the pixel array 200 (e.g., to reduce optical crosstalk between neighboring photodiodes 204 of the pixel array 200). In particular, DTI elements 208 may be formed at or within boundaries of pixel regions 203 of the substrate 202.

In some implementations, one or more semiconductor processing tools may be used to form the one or more DTI elements 208 in the substrate 202. For example, the deposition tool 102 may form a photoresist layer on the first surface 202a of the substrate 202, the exposure tool 104 may expose the photoresist layer to a radiation source to pattern the photoresist layer, the developer tool 106 may develop and remove portions of the photoresist layer to expose the pattern, and the etch tool 108 may etch the one or more portions of substrate 202 to form one or more openings 205, as shown in FIG. 2C. In some implementations, the photoresist removal tool 110 removes the remaining portions of the photoresist layer (e.g., using a chemical stripper and/or another technique) after the etch tool 108 etches the substrate 202. Next, the deposition tool 102 may deposit a dielectric liner layer 206 (e.g., a layer formed from a material with a relatively high dielectric constant (K), such as silicon nitride, silicon oxide, oxynitride, or another type of high-K material) on the first surface 202a and surfaces of the openings 205, as shown in FIG. 2D. Next, the deposition tool 102 may fill the remainder of the openings 205 with a material (e.g., an oxide material such as a silicon oxide ($SiO_x$) or another dielectric material) that provides optical isolation, and the planarization tool 112 may remove excess dielectric material using a CMP technique. FIG. 2E illustrates the pixel array 200 after filling of the openings 205 and the planarization. In some implementations, the one or more DTI elements 208 may be formed in a grid layout in which the one or more DTI elements 208 extend laterally across the substrate 202 and intersect at various locations.

As shown in FIG. 2F, a first portion of a buffer layer 210 may be formed over the first surface 202a of substrate 202 (e.g., on the dielectric liner layer 206 and the DTI elements 208). The buffer layer 210 may function as a passivation layer between the photodiodes 204 and the upper layers of the pixel array 200. In some implementations, the buffer layer 210 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the buffer layer 210 as a passivation layer. In some implementations, a semiconductor processing tool (e.g., the deposition tool 102) may deposit the material over the substrate 202 to form the first portion of the buffer layer 210.

As shown in FIGS. 2G-2J, a light blocking layer 212 is formed. The light blocking layer 212 is a layer to at least partially block light over one or more pixel regions 203 of the pixel array 200 in association with enabling LFR for the pixel array 200 and/or improving dynamic range of the pixel array 200, as described herein. In some implementations, the light blocking layer 212 may be formed from, for example, titanium (Ti), titanium nitride (TiN), or another type of material that at least partially blocks incoming light. In some implementations, portions of the light blocking layer 212 are present over one or more pixel regions 203 of the pixel array 200, while no portion of the light blocking layer 212 is present substantially over one or more other pixel regions 203 of the pixel array 200. For example, as illustrated in FIG. 2J, a first portion of the light blocking layer 212 may be over the pixel region 203a and a second portion of the light blocking layer 212 may be over the pixel region 203c, but no portion of the light blocking layer 212 may be substantially over the pixel region 203b (e.g., no portion of the light blocking layer 212 is present directly above the photodiode 204b in the pixel region 203b, no portion of the light blocking layer 212 is present over an area between the DTI elements 208 at the sides of pixel region 203b, and/or the like). In some implementations, thicknesses vary among portions of the light blocking layer 212 formed over the pixel regions 203, as described below. In some implementations, a given portion of the light blocking layer 212 has a thickness that is less than or equal to approximately 1000 angstroms. In some implementations, the light blocking layer 212 is under a metal grid structure 214 of the pixel array 200 (i.e., the light blocking layer 212 is formed before the metal grid structure 214 is formed).

In some implementations, one or more semiconductor processing tools may be used to form the light blocking layer 212. For example, the deposition tool 102 may deposit a first layer of light blocking material (e.g., Ti, TiN, and/or the like) over the pixel regions 203 of the pixel array 200, as shown in FIG. 2G. The deposition tool 102 may form a photoresist layer on the first layer of light blocking material, the exposure tool 104 may expose the photoresist layer to a radiation source to pattern the photoresist layer, the developer tool 106 may develop and remove portions of the photoresist layer to expose the pattern, and the etch tool 108 may etch the one or more portions of the first layer of light blocking material to form a first layer of a portion of the light blocking layer 212 over the pixel region 203a, as shown in FIG. 2H. In some implementations, the photoresist removal tool 110 removes the remaining portions of the photoresist layer (e.g., using a chemical stripper and/or another technique) after the etch tool 108 etches the first layer of light blocking material. The deposition tool 102 may deposit a second layer of the light blocking material over the pixel regions 203 of the pixel array 200, as shown in FIG. 2I. The deposition tool 102 may form a photoresist layer on the second layer of light blocking material, the exposure tool 104 may expose the photoresist layer to a radiation source to pattern the photoresist layer, the developer tool 106 may develop and remove portions of the photoresist layer to expose the pattern, and the etch tool 108 may etch the one or more portions of the second layer of light blocking material to form a second layer of the portion of the light blocking layer 212 over the pixel region 203a and a portion of the light blocking layer 212 over the pixel region 203c, as shown in FIG. 2J. In some implementations, the photoresist removal tool 110 removes the remaining portions of the photoresist layer (e.g., using a chemical stripper and/or another technique) after the etch tool 108 etches the second layer of light blocking material.

In some implementations, the presence or absence of a portion of the light blocking layer 212 over a given pixel region 203 and a thickness of a portion of the light blocking layer 212 over the given pixel region 203 (when present) may be used to control a QE of the given pixel region 203. For example, in the pixel array 200 shown in FIG. 2J, the first portion of the light blocking layer 212 over the pixel region 203a has a first thickness, the second portion of the light blocking layer 212 over the pixel region 203c has a second thickness that is less than the first thickness, and no portion of the light blocking layer 212 is present directly above the photodiode 204b in the pixel region 203b such that the light blocking layer 212 is not substantially over the pixel region 203b. Here, the first thickness being greater than the second thickness causes a QE of the pixel region 203a to be lower than a QE of the pixel region 203c. Further, no portion of the light blocking layer 212 being substantially over the pixel region 203b causes the pixel region 203b to have a higher QE than the pixel region 203a and the pixel region 203c. Thus, in this example, the pixel region 203a may have a low QE region, the pixel region 203c may have a middle QE region, and the pixel region 203b may have a standard QE region (e.g., since the QE of the pixel region 203b is not modified by the light blocking layer 212). In some implementations, as illustrated in FIG. 2J, the low QE pixel region 203a and the middle QE pixel region 203c may be non-adjacent pixel regions 203 (e.g., the standard QE pixel region 203b may be between the low QE pixel region 203a and the middle QE pixel region 203c in the pixel array 200).

In some implementations, a given portion of the light blocking layer 212 layer can extend to at least a boundary between a pixel region 203 and an adjacent pixel region 203. For example, as shown in FIG. 2J, the first portion of the light blocking layer 212 over the pixel region 203a can extend at least to a boundary between the pixel region 203a and the pixel region 203b (e.g., a boundary defined by a far edge of a DTI element 208 between the pixel region 203a and the pixel region 203b or at a point between a substantial middle of the DTI element 208 between the pixel region 203a and the pixel region 203b). Similarly, the second portion of the light blocking layer 212 over the pixel region 203c can extend at least to a boundary between the pixel region 203c and the pixel region 203b (e.g., a boundary defined by a far edge of a DTI element 208 between the pixel region 203c and the pixel region 203b or at a point between a substantial middle of the DTI element 208 between the pixel region 203c and the pixel region 203b). In some implementations, forming a portion of the light blocking layer 212 in this manner reduces crosstalk between pixel regions 203 of the pixel array 200.

In some implementations, one or more portions of the light blocking layer 212 are formed beneath, on top of, and/or within the buffer layer 210. In some implementations, one or more portions of the light blocking layer 212 may be formed such that the one or more portions of the light blocking layer 212 are at the bottom of the buffer layer 210 (e.g., deposited on the first surface 202a of substrate 202, such as on the dielectric liner layer 206 and the DTI elements 208). In some implementations, one or more portions of the light blocking layer 212 may be formed such that the one or more portions of the light blocking layer 212 are at the top of the buffer layer 210 (e.g., deposited on buffer layer 210). In some implementations, one or more portions of the light blocking layer 212 may be formed such that the one or more portions of the light blocking layer 212 are within the buffer layer 210 (e.g., deposited on buffer layer 210 with an additional buffer layer 210 deposited on the one or more portions of the light blocking layer 212, as shown in FIG. 2K).

As shown in FIG. 2K, a second portion of buffer layer 210 may be formed over the first surface 202a of substrate 202 (e.g., on the light blocking layer 212 and the first portion of the buffer layer 210). In some implementations, a semiconductor processing tool (e.g., the deposition tool 102) may deposit the material over the substrate 202 to form the second portion of the buffer layer 210 and the planarization tool 112 may remove excess material using a CMP technique. In some implementations, a total thickness of the buffer layer 210 may be in a range from approximately 500 angstroms to approximately 3000 angstroms.

As shown in FIGS. 2L and 2M, a metal grid structure 214 may be formed on over the plurality of pixel regions 203 (e.g., on the buffer layer 210). The metal grid structure 214 is a structure to improve isolation among photodiodes 204 of the pixel array 200. For example, the metal grid structure 214 may direct light between a given photodiode 204 and a neighboring photodiode 204 such that optical crosstalk is reduced and/or such that light sensitivity of the photodiode 204 is improved. In some implementations, the metal grid structure 214 includes a metal material, such as tungsten or another type of metal material with reflective properties. In some implementations, the metal grid structure 214 is formed in a grid layout in which the metal grid structure 214 extends laterally across the substrate 202 and intersects at various locations. In some implementations, a height of an element of the metal grid structure 214 may be in a range from approximately 1500 angstroms to approximately 3000 angstroms. In some implementations, a width of an element of the metal grid structure 214 may be in a range from approximately 190 nanometers to approximately 500 nanometers.

In some implementations, one or more semiconductor processing tools may be used to form the metal grid structure 214. For example, the deposition tool 102 may deposit a layer of metal material from which the metal grid structure 214 is to be formed, as shown in FIG. 2L. The deposition tool 102 may form a photoresist layer on the layer of metal material, the exposure tool 104 may expose the photoresist layer to a radiation source to pattern the photoresist layer, the developer tool 106 may develop and remove portions of the photoresist layer to expose the pattern, and the etch tool 108 may etch the one or more portions of the layer of metal material to from metal grid elements of the metal grid structure 214, as shown in FIG. 2M. In some implementations, the photoresist removal tool 110 removes the remaining portions of the photoresist layer (e.g., using a chemical stripper and/or another technique) after the etch tool 108 etches the layer of metal material.

As shown in FIG. 2N, an oxide layer 216 may be formed over the first surface 202a of substrate 202 (e.g., on the metal grid structure 214 and the buffer layer 210). In some implementations, the oxide layer 216 may function to provide protection for other layers of the pixel array 200. In some implementations, the oxide layer 216 includes an oxide material such as a silicon oxide ($SiO_x$). In some implementations, a semiconductor processing tool (e.g., the deposition tool 102) may deposit the material over the substrate 202 to form the oxide layer 216.

The number and arrangement of components, structures, and/or layers shown in FIGS. 2A-2N are provided as one or more examples. In practice, there may be additional components, structures, and/or layers; fewer components, structures, and/or layers; different components, structures, and/or layers; and/or differently arranged components, structures, and/or layers than those shown in FIGS. 2A-2N. That is, as indicated above, FIGS. 2A-2N are provided as an example, and other examples may differ from what is described with regard to FIGS. 2A-2N.

Figure 3:
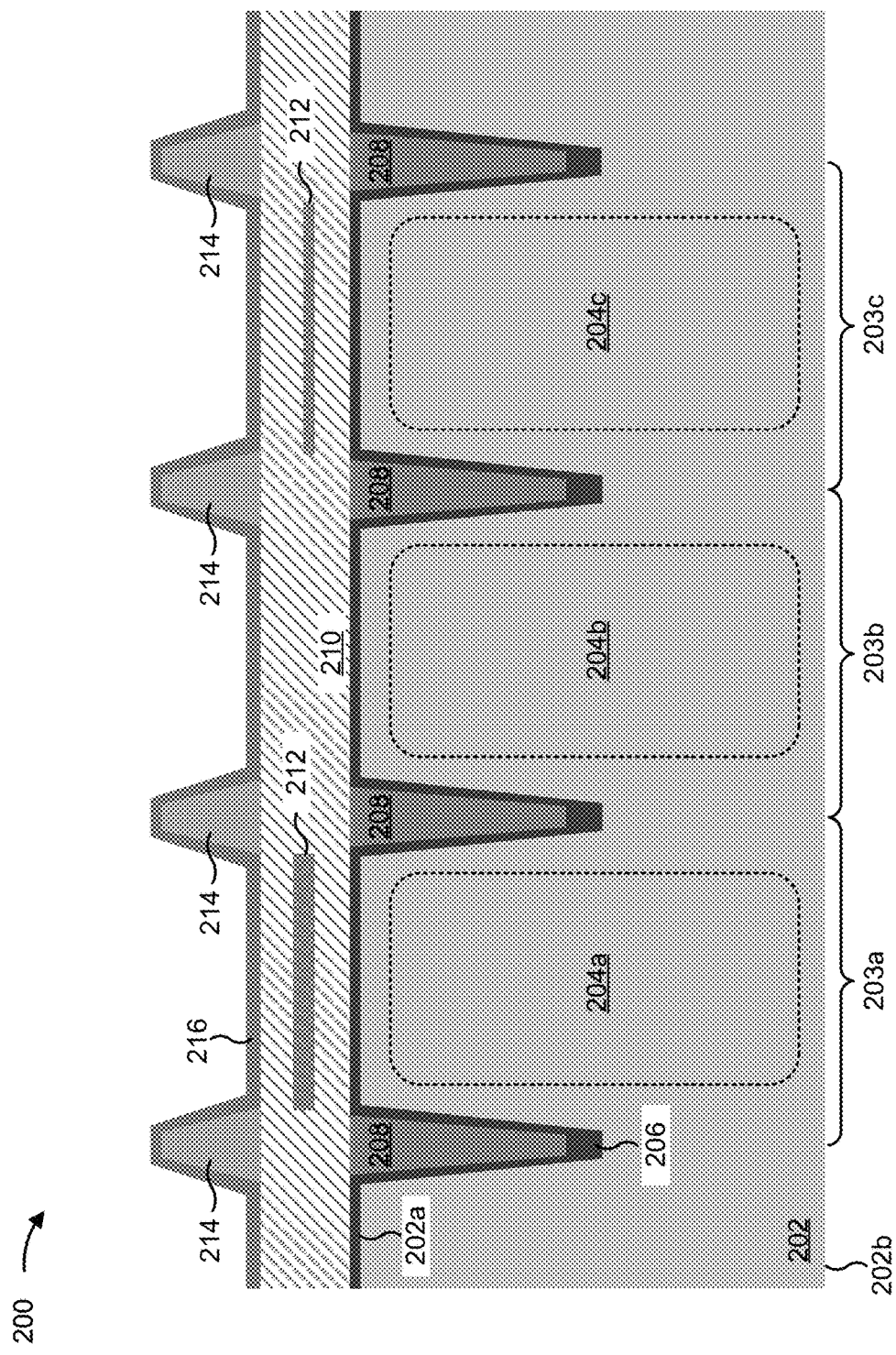
FIG. 3 is a diagram of an example another pixel array that enables LED flicker reduction and improved dynamic range, as described herein.

FIG. 3 is a diagram of a pixel array 200 that enables LFR and improved dynamic range. As shown in FIG. 3, the pixel array 200 includes components described in connection with FIGS. 2A-2N.

In the pixel array 200, with regard to FIG. 3 and in contrast to FIGS. 2A-2N, a length of a given portion of the light blocking layer 212 is shorter than a length of the light blocking layer 212 of the pixel array 200 of FIGS. 2A-2N. For example, as shown in FIG. 3, the first portion of the light blocking layer 212 over the pixel region 203a can extend at least to a boundary between the pixel region 203a and the pixel region 203b (e.g., a boundary defined by a near edge of a DTI element 208 between the pixel region 203a and the pixel region 203b). Similarly, the second portion of the light blocking layer 212 over the pixel region 203c can extend at least to a boundary between the pixel region 203c and the pixel region 203b (e.g., a boundary defined by a near edge of a DTI element 208 between the pixel region 203c and the pixel region 203b). In some implementations, having a shorter length for a portion of the light blocking layer 212 for a given pixel region 203 reduces interference with operation of a neighbor pixel region 203 of the pixel array 200.

As indicated above, FIG. 3 is provided as an example. Other examples may differ from what is described with regard to FIG. 3.

Figure 4:
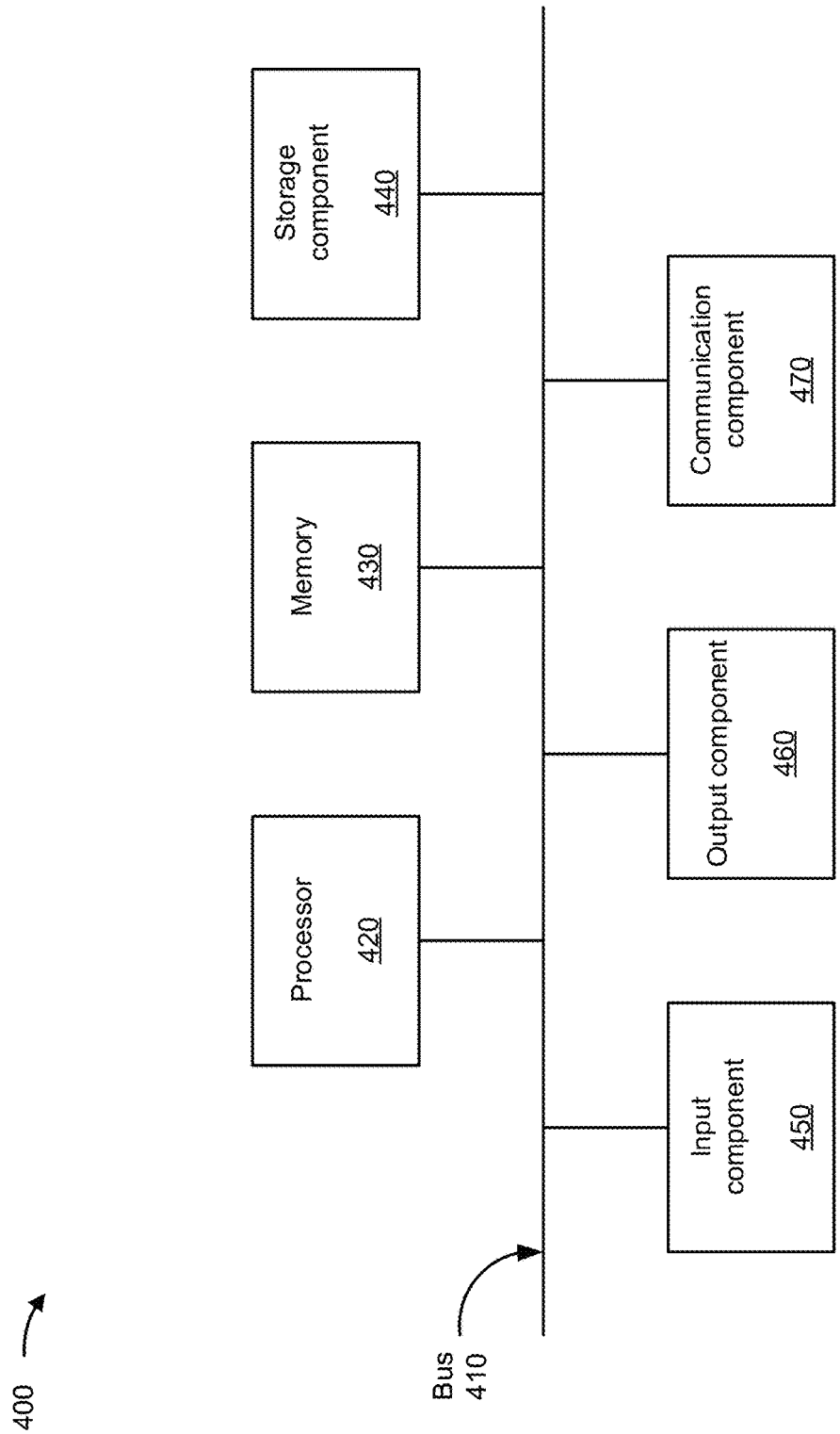
FIG. 4 is a diagram of example components of one or more devices of FIG. 1.

FIG. 4 is a diagram of example components of a device 400. In some implementations, one or more of the semiconductor processing tools 102-114 and/or the wafer/die handling device 116 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, an actuator, and/or the like. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, an antenna, and/or the like.

Device 400 may perform one or more processes described herein. For example, a non-transitory computer-readable medium (e.g., memory 430 and/or storage component 440) may store a set of instructions (e.g., one or more instructions, code, software code, program code, and/or the like) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
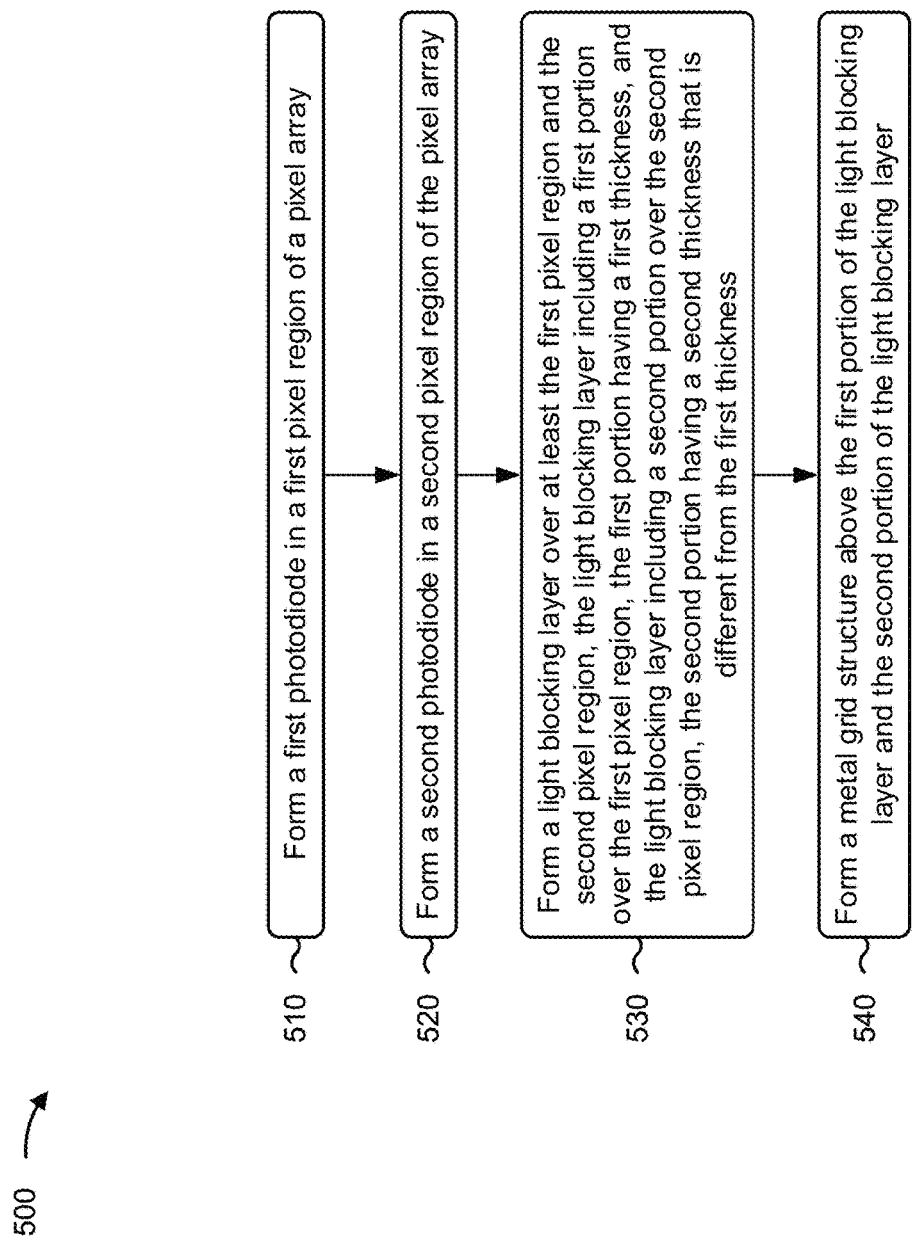
FIG. 5 is a flowchart of an example process relating to forming a pixel array that enables LED flicker reduction and improved dynamic range.

FIG. 5 is a flowchart of an example process 500 relating to forming a pixel array 200 that enables LFR and improved dynamic range. In some implementations, one or more process blocks of FIG. 5 may be performed by a semiconductor processing tool (e.g., one or more of the semiconductor processing tools 102-114 described above). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include forming a first photodiode in a first pixel region of a pixel array (block 510). For example, one or more semiconductor processing tools (e.g., the implantation tool 114) may form a first photodiode 204a in a first pixel region 203a of a pixel array 200, as described above.

As further shown in FIG. 5, process 500 may include forming a second photodiode in a second pixel region of the pixel array (block 520). For example, one or more semiconductor processing tools (e.g., the implantation tool 114) may form a second photodiode 204c in a second pixel region 203c of the pixel array 200, as described above.

As further shown in FIG. 5, process 500 may include forming a light blocking layer over at least the first pixel region and the second pixel region, the light blocking layer including a first portion over the first pixel region, the first portion having a first thickness, and the light blocking layer including a second portion over the second pixel region, the second portion having a second thickness that is different from the first thickness (block 530). For example, one or more semiconductor processing tools (e.g., the deposition tool 102, the etching tool 108, and/or the like) may form a light blocking layer 212 over at least the first pixel region 203a and the second pixel region 203c, the light blocking layer 212 including a first portion over the first pixel region 203a, the first portion having a first thickness, and the light blocking layer 212 including a second portion over the second pixel region 203c, the second portion having a second thickness that is different from the first thickness, as described above.

As further shown in FIG. 5, process 500 may include forming a metal grid structure above the first portion of the light blocking layer and the second portion of the light blocking layer (block 540). For example, one or more semiconductor processing tools (e.g., the deposition tool 102, the etching tool 108, and/or the like) may form a metal grid structure 214 above the first portion of the light blocking layer 212 and the second portion of the light blocking layer 212, as described above.

Process 500 may include additional implementations, such as any single implementation or any combination of implementations described below and/or in connection with one or more other processes described elsewhere herein.

In a first implementation, the second thickness being different from the first thickness causes a QE of the second pixel region 203c to be different from a QE of the first pixel region 203a.

In a second implementation, alone or in combination with the first implementation, process 500 includes forming a third photodiode 204b in a third pixel region 203b of the pixel array 200, wherein no portion of the light blocking layer 212 is formed substantially over the third pixel region 203b.

In a third implementation, alone or in combination with one or more of the first and second implementations, forming the light blocking layer 212 comprises depositing a first layer of light blocking material over at least the first pixel region 203a and the second pixel region 203c, etching the first layer of light blocking material such that a portion of the first layer of light blocking material is over the first pixel region 203a and such that no portion of the first layer of light blocking material is over the second pixel region 203c, depositing a second layer of light blocking material over at least the first pixel region 203a and the second pixel region 203c, and etching the second layer of light blocking material such that a portion of the second layer of light blocking material is over the first pixel region 203a and such that a portion of the second layer of light blocking material is over the second pixel region 203c.

In a fourth implementation, alone or in combination with one or more of the first through third implementations, process 500 includes depositing at least a portion of a buffer layer 210 prior to depositing the first layer of the light blocking material.

In a fifth implementation, alone or in combination with one or more of the first through fourth implementations, process 500 includes depositing at least a portion of a buffer layer 210 after etching the second layer of the light blocking material.

In a sixth implementation, alone or in combination with one or more of the first through fifth implementations, at least one of the first portion of the light blocking layer 212 is formed to extend to at least a boundary between the first pixel region 203a and a pixel region adjacent to the first pixel region 203a, or the second portion of the light blocking layer is formed to extend to at least a boundary between the second pixel region 203c and a pixel region adjacent to the second pixel region 203c.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, a pixel array may include a light blocking layer that enables LFR and improves dynamic range. In some implementations, the light blocking layer is formed before the metal grid structure, meaning that the light blocking layer is beneath the metal grid structure (e.g., rather than being formed on or over the metal grid structure). By forming the light blocking layer such that the light blocking layer is beneath the metal grid structure, dimensions of the metal grid structure do not impact uniformity and thickness of the light blocking layer. As a result, the uniformity and thickness of the light blocking layer can be tightly controlled even with miniaturization of the metal grid structure, without impacting performance of the pixel array. Furthermore, a thickness of the light blocking layer can differ over different pixel regions of the pixel array, meaning that the pixel array may be a multi-QE pixel array that enables improved dynamic range. Additionally, in some implementations, the light blocking layer may serve to reduce crosstalk between pixel regions of the pixel array.

As described in greater detail above, some implementations described herein provide a pixel array. The pixel array includes a plurality of pixel regions including a first pixel region and a second pixel region. The pixel array includes a metal grid structure over the plurality of pixel regions. The pixel array includes a light blocking layer, a first portion of the light blocking layer being over the first pixel region and under the metal grid structure, the first portion having a first thickness, and a second portion of the light blocking layer being over the second pixel region and under the metal grid structure, the second portion having a second thickness that is different from the first thickness.

As described in greater detail above, some implementations described herein provide a method. The method includes forming a first photodiode in a first pixel region of a pixel array. The method includes forming a second photodiode in a second pixel region of the pixel array. The method includes forming a light blocking layer over at least the first pixel region and the second pixel region, the light blocking layer including a first portion over the first pixel region, the first portion having a first thickness, and the light blocking layer including a second portion over the second pixel region, the second portion having a second thickness that is different from the first thickness. The method includes forming a metal grid structure above the first portion of the light blocking layer and the second portion of the light blocking layer.

As described in greater detail above, some implementations described herein provide a pixel array. The pixel array includes a plurality of pixel regions including a first pixel region, a second pixel region, and a third pixel region. The pixel array includes a metal grid structure including a first metal grid element and a second metal grid element, the first metal grid element being over a boundary between the first pixel region and the third pixel region, and the second metal grid element being over a boundary between the second pixel region and the third pixel region. The pixel array includes a light blocking layer above the plurality of pixel regions and below the metal grid structure, the light blocking layer including a first portion and a second portion, the first portion having a first thickness and being over the first pixel region and extending at least to a boundary between the first pixel region and the third pixel region, the second portion having a second thickness and being over the second pixel region and extending at least to a boundary between the second pixel region and the third pixel region or a fourth pixel region, the second thickness being different from the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array, comprising:
a plurality of pixel regions, of a substrate, including a first pixel region, a second pixel region, and a third pixel region;
a dielectric liner on a surface of the substrate and on a surface of each of a plurality of openings in the substrate, wherein each of the plurality of openings comprises angled sidewalls;
a plurality of deep trench isolation (DTI) elements, in the plurality of openings and on the dielectric liner, including:
a first DTI element adjacent to a first side of the first pixel region, and
a second DTI element between a second side of the first pixel region and the second pixel region or between the second pixel region and the third pixel region;
a buffer layer over the plurality of pixel regions and the plurality of DTI elements, wherein the buffer layer comprises a first material and the plurality of DTI elements comprises a second material different from the first material;
a metal grid structure, over the plurality of pixel regions and the buffer layer, comprising angled sidewalls configured to direct incoming light to one of the plurality of pixel regions, wherein the angled sidewalls of the metal grid structure reside above, and are at an opposite angle from, the angled sidewalls of the plurality of openings;

an oxide layer over, and in direct contact with, the metal grid structure and the buffer layer, wherein the oxide layer comprises a first portion residing on a top surface of the metal grid structure and a second portion residing on a top surface of the buffer layer, wherein a top surface of the first portion resides above a top surface of the second portion; and
a light blocking layer,
a first portion of the light blocking layer being over the first pixel region and under the metal grid structure, the first portion having a first thickness; and
a second portion of the light blocking layer being over the third pixel region and having a second thickness that is different from the first thickness.

2. The pixel array of claim 1, wherein the first thickness is greater than the second thickness.

3. The pixel array of claim 1, wherein the light blocking layer is not over the second pixel region.

4. The pixel array of claim 1, wherein at least one of the first portion of the light blocking layer or the second portion of the light blocking layer is within the buffer layer.

5. The pixel array of claim 1, wherein at least one of the first portion of the light blocking layer or the second portion of the light blocking layer is on a surface of the buffer layer.

6. The pixel array of claim 1, wherein the first pixel region and the second pixel region are adjacent pixel regions of the pixel array, and wherein the first pixel region and the third pixel region are non-adjacent pixel regions of the pixel array.

7. The pixel array of claim 1, wherein at least one of:
the first portion of the light blocking layer extends at least to a boundary between the first pixel region and the second pixel region, or
the second portion of the light blocking layer extends at least to a boundary between the second pixel region and the third pixel region.

8. A pixel array, comprising:
a plurality of pixel regions, of a substrate, including a first pixel region, a second pixel region, and a third pixel region, wherein each of the plurality of pixel regions comprises a photodiode entirely surrounded by the substrate;
a plurality of deep trench isolation (DTI) elements, that each comprises a material that provides optical isolation, including:
a first DTI element, comprising angled sidewalls, between the first pixel region and the second pixel region, and
a second DTI element, comprising angled sidewalls, between the second pixel region and the third pixel region;
a buffer layer over the plurality of pixel regions and the plurality of DTI elements, wherein the buffer layer comprises a first material and the plurality of DTI elements comprises a second material different from the first material;
a metal grid structure including:
a first metal grid element, comprising angled sidewalls, over a boundary, between the first pixel region and the second pixel region, and the buffer layer, and
a second metal grid element, comprising angled sidewalls, over a boundary, between the second pixel region and the third pixel region, and the buffer layer, wherein the angled sidewalls of each of the first metal grid element and the second metal grid element are at an opposite angle from the angled sidewalls of each of the first DTI element and the second DTI element;

an oxide layer over, and in direct contact with, the metal grid structure and the buffer layer; and
a light blocking layer comprising:
a first portion, having a first thickness, over the first pixel region, and
a second portion, having a second thickness different from the first thickness, over the third pixel region.

9. The pixel array of claim 8, wherein no portion of the light blocking layer is substantially over the second pixel region.

10. A pixel array, comprising:
a plurality of pixel regions, of a substrate, including a first pixel region, a second pixel region, and a third pixel region, wherein each of the plurality of pixel regions comprises a photodiode entirely surrounded by the substrate;
a plurality of deep trench isolation (DTI) elements, that each comprises a material that provides optical isolation, including:
a first DTI element, comprising angled sidewalls, between the first pixel region and the second pixel region, and
a second DTI element, comprising angled sidewalls, between the second pixel region and the third pixel region;
a metal grid structure including:
a first metal grid element, comprising angled sidewalls, over a boundary between the first pixel region and the second pixel region, and
a second metal grid element, comprising angled sidewalls, being over a boundary between the second pixel region and the third pixel region,
wherein the angled sidewalls of each of the first metal grid element and the second metal grid element are at an opposite angle from the angled sidewalls of each of the first DTI element and the second DTI element;
a buffer layer above the plurality of pixel regions and below the metal grid structure, wherein the buffer layer comprises a first material and the plurality of DTI elements comprises a second material different from the first material; and
an oxide layer over, and in direct contact with, the metal grid structure and the buffer layer.

11. The pixel array of claim 10, wherein the buffer layer comprises a light blocking layer over the first pixel region and the third pixel region.

12. The pixel array of claim 10, wherein the second pixel region is between the first pixel region and the third pixel region.

13. The pixel array of claim 11, wherein no portion of the light blocking layer is substantially over the second pixel region.

14. The pixel array of claim 8, wherein at least one of the first portion of the light blocking layer or the second portion of the light blocking layer is within the buffer layer.

15. The pixel array of claim 8, wherein a boundary of at least one of the plurality of pixel regions partially overlaps with a boundary of at least another one of the plurality of pixel regions.

16. The pixel array of claim 10, wherein the plurality of DTI elements are in the substrate, and wherein the plurality of DTI elements extend laterally across the substrate and intersect with each other.

17. The pixel array of claim 8, further comprising:
a dielectric liner layer in a plurality of openings in a substrate, wherein the plurality of DTI elements resides on the dielectric liner layer and in the plurality of openings.

18. The pixel array of claim 1, wherein the first portion or the second portion of the light blocking layer is under two metal grids of the metal grid structure, wherein an outer boundary of the first portion or the second portion of the light blocking layer does not exceed an outer boundary of the two metal grids.

19. The pixel array of claim 8, wherein a bottom surface of the photodiode is lower than a bottom surface of the plurality of DTI elements.

20. The pixel array of claim 10, wherein a bottom surface of the photodiode is lower than a bottom surface of the plurality of DTI elements.

* * * * *